(12) United States Patent
Moon

(10) Patent No.: US 7,546,564 B2
(45) Date of Patent: Jun. 9, 2009

(54) METHOD FOR VERIFYING OPTICAL PROXIMITY CORRECTION USING LAYER VERSUS LAYER COMPARISON

(75) Inventor: Jae In Moon, Gyunggi-do (KR)

(73) Assignee: Hynix Semiconductor Inc., Icheon-shi (KR)

( * ) Notice: Subject to any disclaimer, the term of this patent is extended or adjusted under 35 U.S.C. 154(b) by 177 days.

(21) Appl. No.: 11/321,579

(22) Filed: Dec. 28, 2005

(65) Prior Publication Data

US 2007/0067752 A1 Mar. 22, 2007

(30) Foreign Application Priority Data

Sep. 20, 2005 (KR) .................. 10-2005-0087202

(51) Int. Cl.
*G06F 17/50* (2006.01)

(52) U.S. Cl. .................. 716/5; 716/1; 716/21

(58) Field of Classification Search .................. 716/1, 716/5, 21
See application file for complete search history.

(56) References Cited

U.S. PATENT DOCUMENTS

| | | | |
|---|---|---|---|
| 6,077,310 A * | 6/2000 | Yamamoto et al. ............ 716/19 |
| 6,451,680 B1 | 9/2002 | Wang | |
| 6,934,929 B2 | 8/2005 | Brist et al. | |
| 7,175,940 B2 * | 2/2007 | Laidig et al. ............ 430/5 |
| 2003/0140330 A1 * | 7/2003 | Tanaka et al. ............ 716/19 |
| 2005/0008942 A1 * | 1/2005 | Cheng et al. ............ 430/5 |
| 2005/0153217 A1 * | 7/2005 | Izuha et al. ............ 430/5 |
| 2005/0219515 A1 * | 10/2005 | Morohoshi ............ 356/124 |
| 2006/0008135 A1 * | 1/2006 | Nojima ............ 382/145 |
| 2007/0042277 A1 * | 2/2007 | Hsu et al. ............ 430/5 |
| 2007/0061773 A1 * | 3/2007 | Ye et al. ............ 716/21 |
| 2007/0162889 A1 * | 7/2007 | Broeke et al. ............ 716/21 |

FOREIGN PATENT DOCUMENTS

| | | |
|---|---|---|
| JP | 10273717 | 4/2000 |
| JP | 2002212945 | 2/2004 |
| JP | 2002326056 | 6/2004 |
| JP | 2003180447 | 1/2005 |

* cited by examiner

*Primary Examiner*—Paul Dinh
*Assistant Examiner*—Suchin Parihar
(74) *Attorney, Agent, or Firm*—Townsend and Townsend and Crew LLP

(57) ABSTRACT

A method for verifying optical proximity correction (OPC) using a layer-versus-layer (LVL) comparison. The method includes performing optical proximity correction of an original design of a semiconductor device to prepare a revised design of the semiconductor device; comparing the revised design and the original design with each other; dividing deviation patterns, obtained by results of the comparison, according to an illuminating system; and comparing the divided deviation patterns respectively to reference values to determine whether or not any error in the optical proximity correction occurs.

9 Claims, 10 Drawing Sheets

METHOD FOR VERIFYING OPTICAL PROXIMITY CORRECTION USING LAYER VERSUS LAYER COMPARISON

CROSS REFERENCE TO RELATED APPLICATIONS

The present application claims priority to Korean Patent Application No. 10-2005-0087202, filed Sep. 20, 2005 and is incorporated by reference.

BACKGROUND OF THE INVENTION

The present invention relates to a method for fabricating a semiconductor device, and more particularly to a method for verifying optical proximity correction using layer versus layer comparison.

As methods for verifying designs of semiconductor memory devices, such as DRAMs, Design Rule Check (DRC), Layer versus schematic (LVS) comparison, and Layer versus layer (LVL) comparison are used. Particularly, in order to compare an original design of a semiconductor device to a revised design thereof obtained by Optical Proximity Correction (OPC), the LVL comparison is mainly used.

FIG. 1 is a flow chart illustrating a conventional method for verifying optical proximity correction using layer versus layer comparison. FIGS. 2 to 4 are schematic plan views illustrating the method of FIG. 1.

With reference to FIGS. 1 to 4, an original design 200 of a semiconductor device is prepared (step 110). Here, the original design 200 refers to a drawing, on which various patterns 210 for forming unit components of the semiconductor device are disposed. After the original design 200 is prepared, a revised design 300 of the semiconductor device in consideration of an optical proximity effect is obtained by OPC (step 120). Generally, the optical proximity effect means a phenomenon in which as the size of a pattern reaches the limit of resolution, the pattern is damaged by diffraction and interference of light. Accordingly, damaged patterns 310 are disposed in the revised design 300. Thereafter, the original design 200 and the revised design 300 are compared with each other (step 130). By comparing deviation patterns 410 and 420, obtained by results of the above comparison, to reference values, it is determined whether or not the original design 200 contains errors, i.e., whether or not any pattern is omitted from the original design 200, and whether or not the revised design 300 contains errors, i.e., whether or not the revised design 300 is obtained in conformity with a designated rule (step 140).

Since only the sizes of the patterns of the original designs 200 and the revised design 300 are compared with each other, the above conventional method does not take into consideration influence of exposure conditions. For example, according to types of an illuminating system, which is one of the exposure conditions, and particularly according to directions of an off-axis illuminating (OAI) system, different results are obtained. Accordingly, it is difficult to correctly and accurately inspect differences between the original design and the revised design using the method above.

BRIEF SUMMARY OF THE INVENTION

An embodiment of the present invention provides a method for verifying optical proximity correction using layer versus layer (LVL) comparison, which enables correct and accurate inspection of differences between an original design of a semiconductor device and a revised design of the semiconductor device and verification of accuracy of the optical proximity correction.

In accordance with one aspect of the present invention, the above and other objects can be accomplished by the provision of a method for verifying optical proximity correction using layer versus layer comparison comprising: performing optical proximity correction of an original design of a semiconductor device to prepare a revised design of the semiconductor device; comparing the revised design and the original design with each other; dividing deviation patterns, obtained by results of the comparison, according to an illuminating system; and comparing the divided deviation patterns respectively to reference values to determine whether or not any error in the optical proximity correction occurs.

The comparison between the revised design and the original design may be carried out by verifying a degree of coincidence between patterns of the original design and patterns of the revised design.

In the division of the deviation patterns obtained by results of the comparison, the deviation patterns may be divided according to directions corresponding to the directionality of the illuminating system. Preferably, in the division of the deviation patterns obtained by results of the comparison, the deviation patterns may be divided into patterns in orthogonal directions and patterns in oblique directions when the illuminating system is a crosspole or quadrapole illuminating system. The deviation patterns may be divided into patterns in a horizontal direction and patterns in a vertical direction when the illuminating system is a dipole illuminating system. The deviation patterns may be divided into patterns in N directions corresponding to angles of openings of the illuminating system when the illuminating system is a multipole illuminating system having the openings prepared in the number of N.

Preferably, the method may further comprise removing edge portions of the deviation patterns obtained by results of the comparison, after the comparison between the revised design and the original design.

In accordance with another aspect of the present invention, there is provided a method for verifying optical proximity correction using layer versus layer comparison comprising: performing optical proximity correction of an original design of a semiconductor device using a dipole illuminating system to prepare a revised design of the semiconductor device; comparing the revised design and the original design with each other; dividing deviation patterns, obtained by results of the comparison, into first deviation patterns formed in a vertical direction and second deviation patterns formed in a horizontal direction; comparing the first deviation patterns to a first reference value to determine whether or not any error in the optical proximity correction of patterns disposed in the vertical direction occurs; and comparing the second deviation patterns to a second reference value to determine whether or not any error in the optical proximity correction of patterns disposed in the horizontal direction occurs.

The comparison between the revised design and the original design may be carried out by verifying a degree of coincidence between patterns of the original design and patterns of the revised design.

The method may further comprise removing edge portions of the first and second deviation patterns, obtained by results of the comparison, after the comparison between the revised design and the original design.

DETAILED DESCRIPTION OF THE INVENTION

Now, a preferred embodiment of the present invention will be described in detail with reference to the accompanying drawings. Those skilled in the art will appreciate that various modifications of the preferred embodiment are possible and the modifications do not limit the scope and spirit of the invention as disclosed in the accompanying claims.

Figure 1:
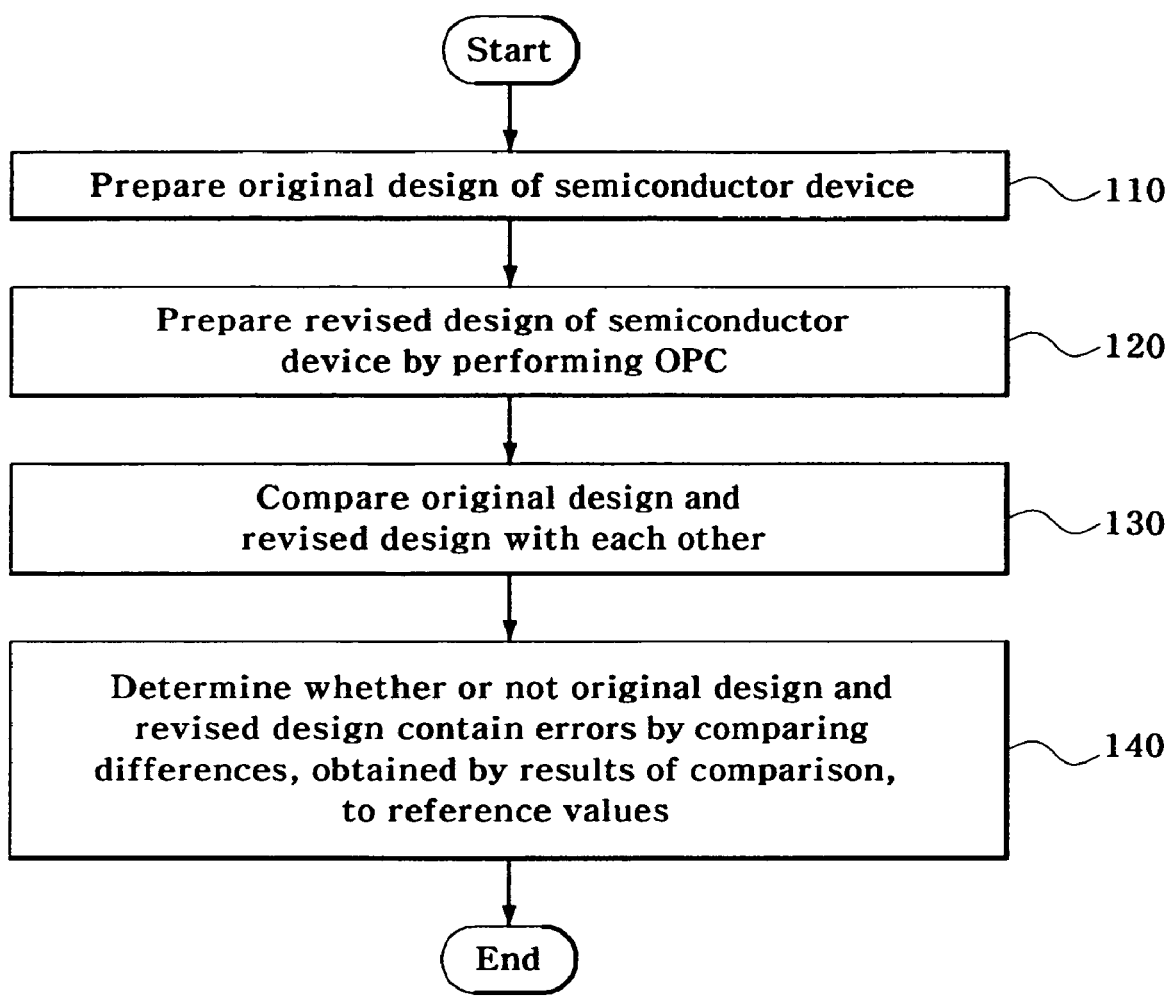
FIG. 1 is a flow chart illustrating a conventional method for verifying optical proximity correction using layer versus layer comparison.
Figure 2:
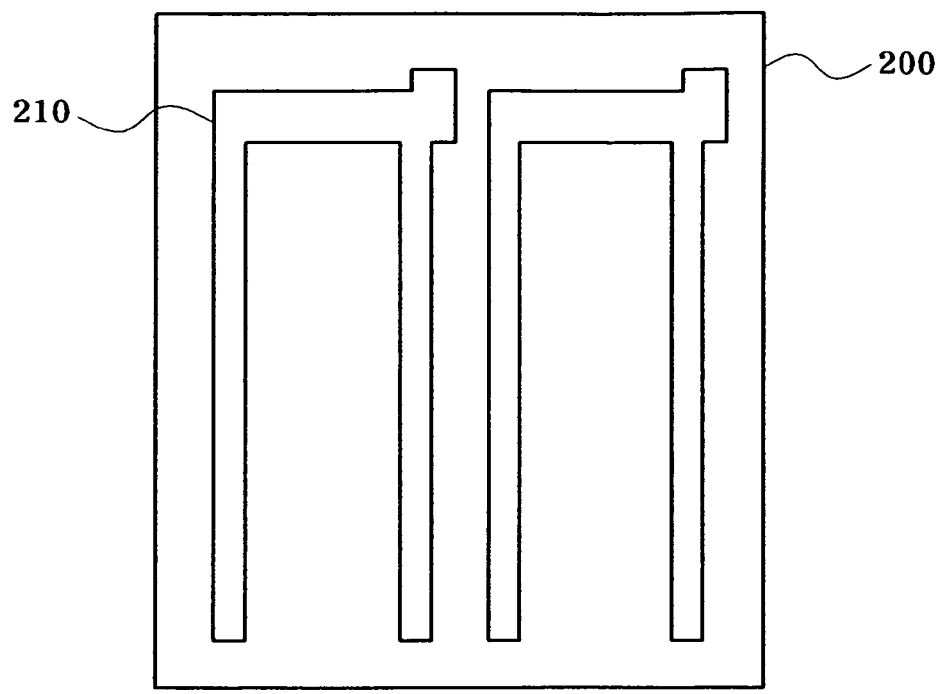
FIGS. 2 to 4 are schematic plan views illustrating the method of FIG. 1.
Figure 3:
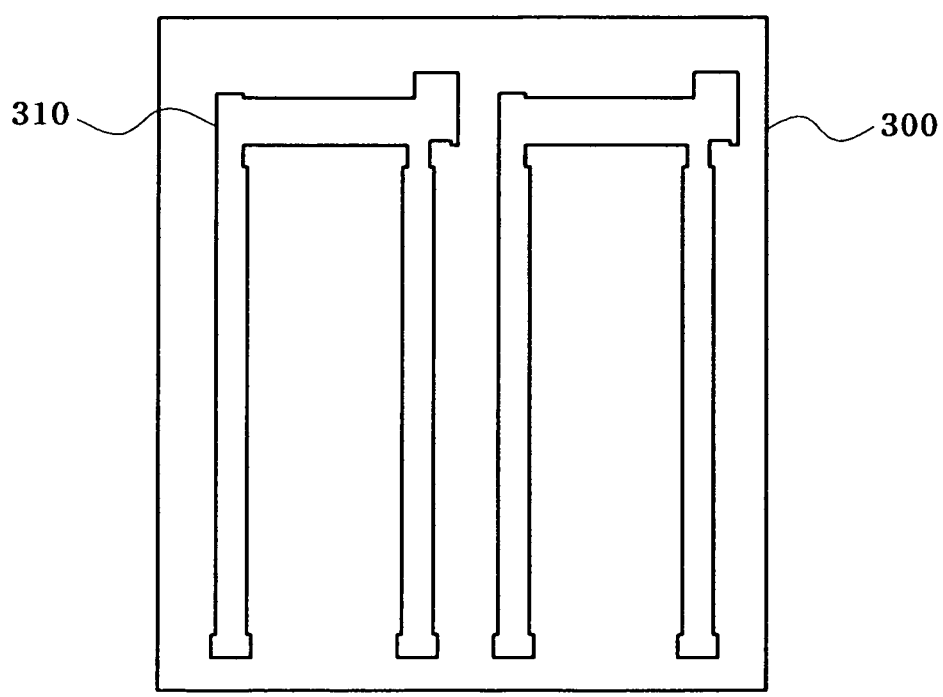
Figure 4:
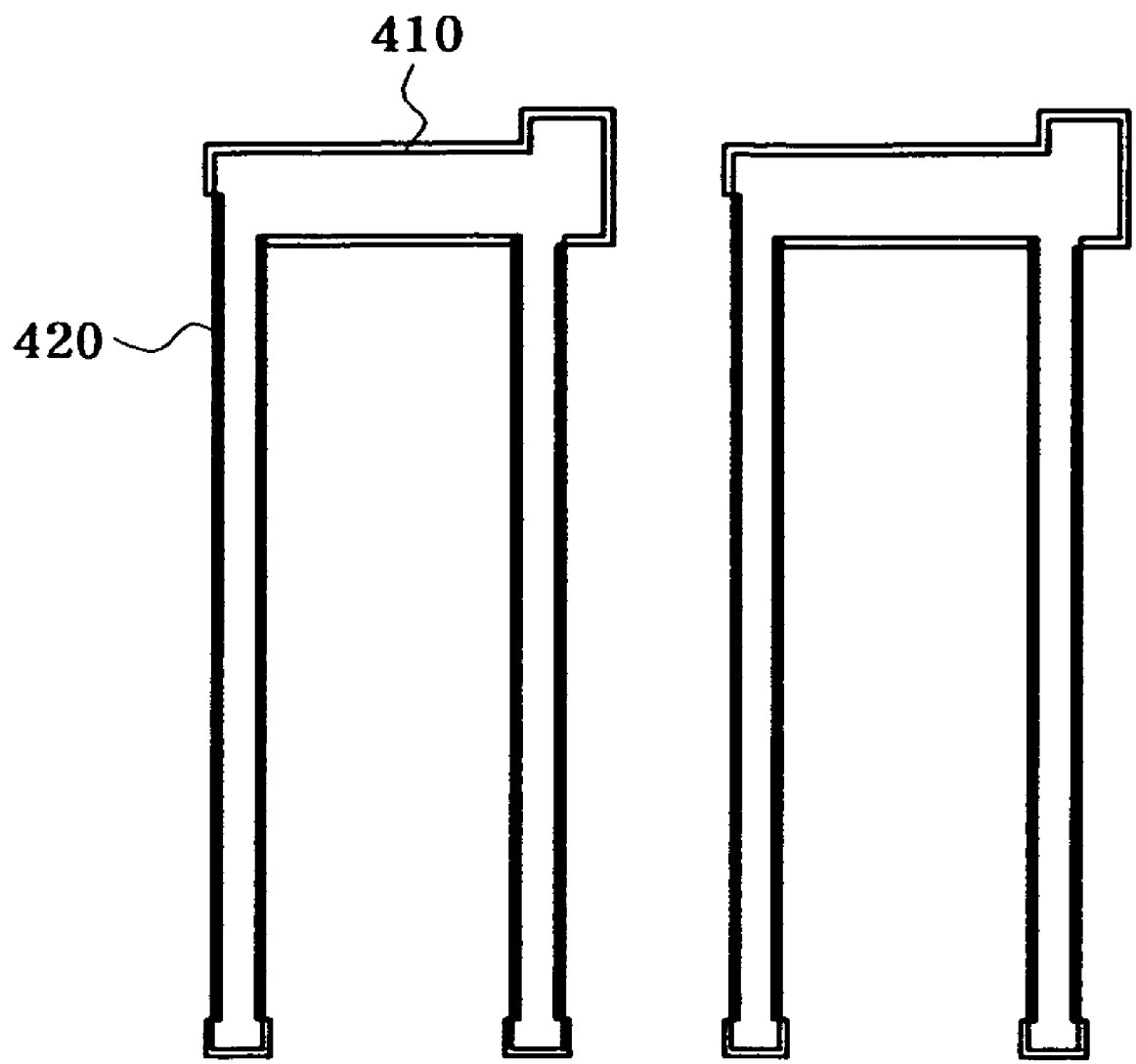
Figure 5:
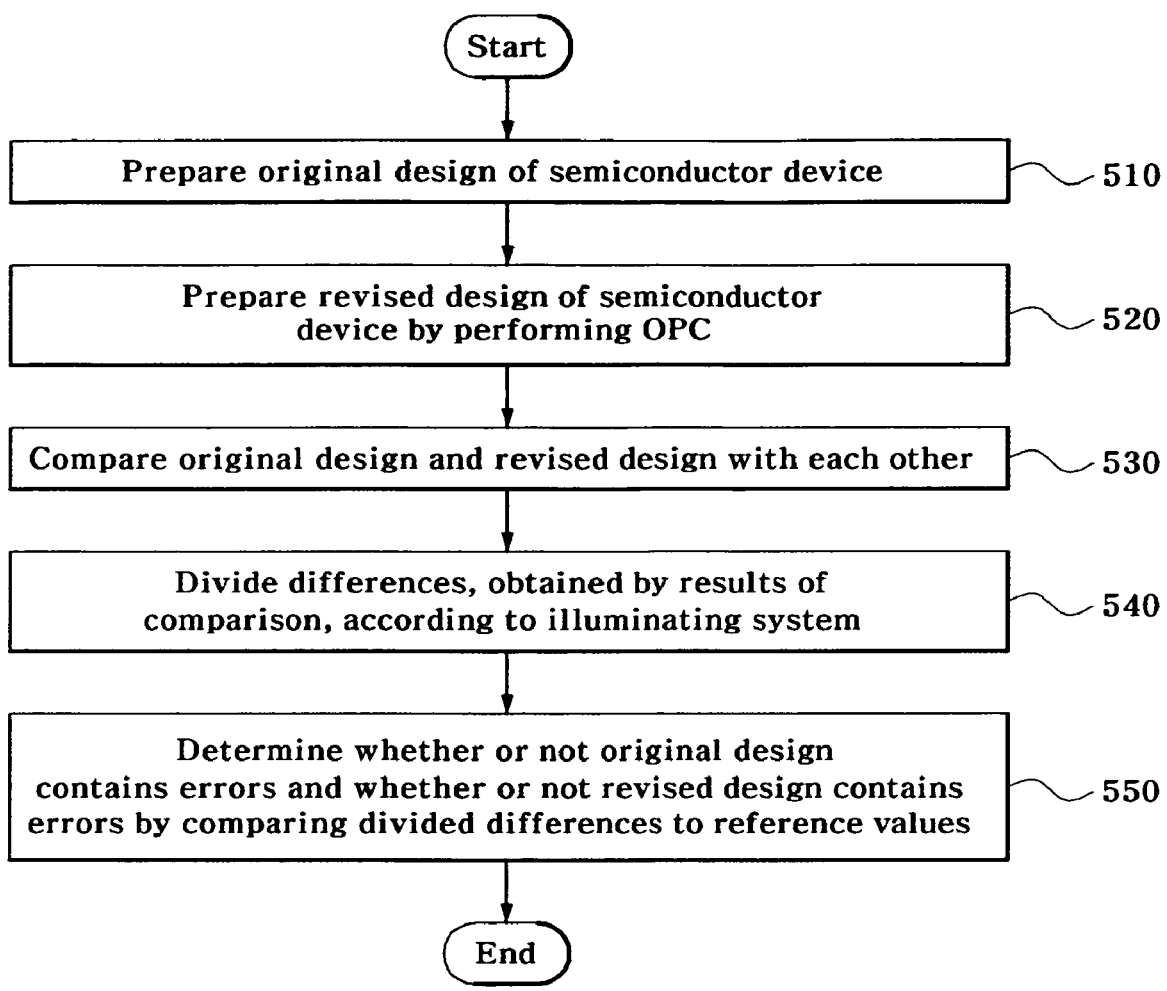
FIG. 5 is a flow chart illustrating a method for verifying optical proximity correction using layer versus layer comparison in accordance with the present invention.
Figure 6:
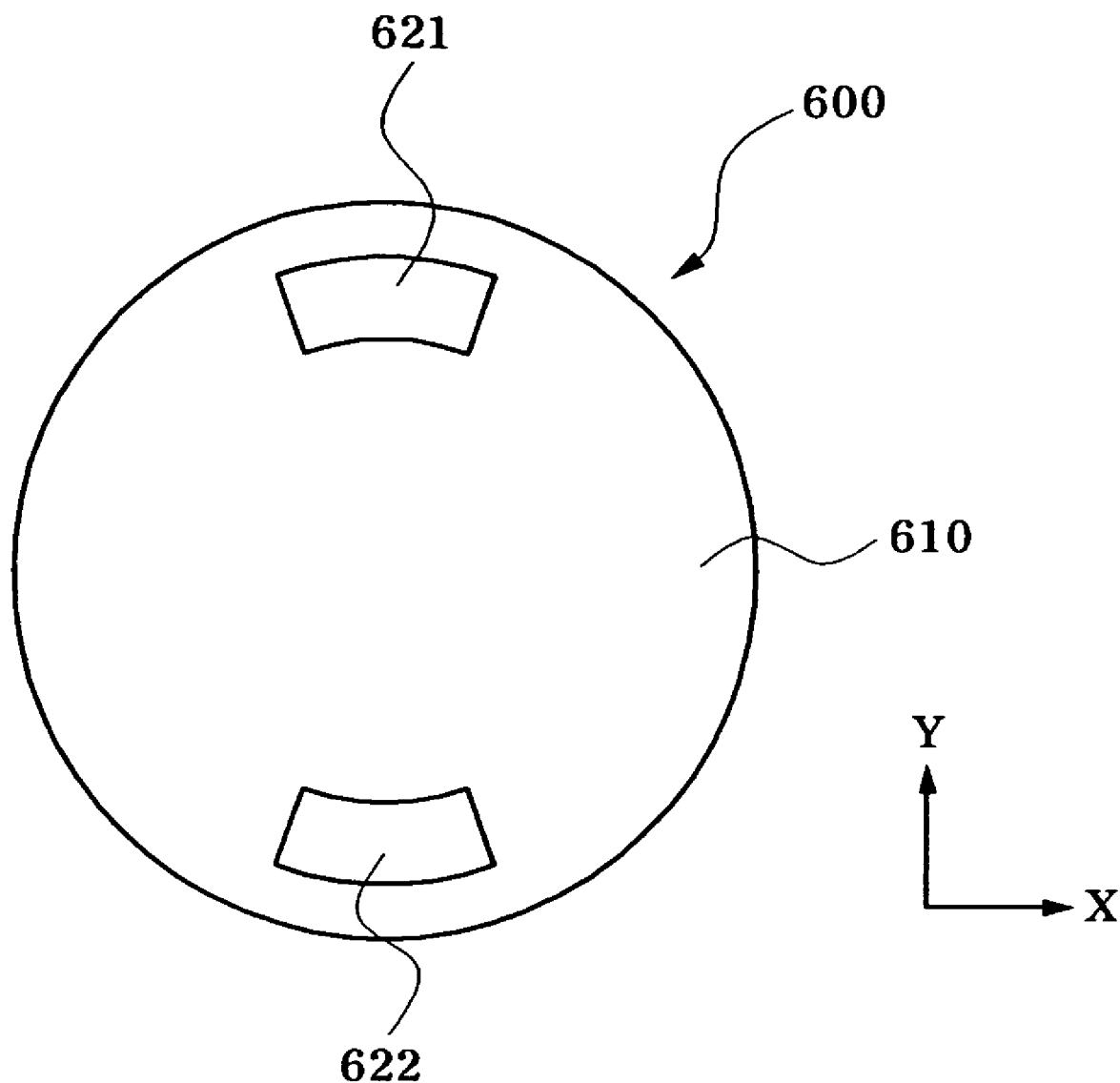
FIGS. 6 and 7 are schematic plan views of various illuminating systems used in step 540 of the method of FIG. 5.
Figure 7:
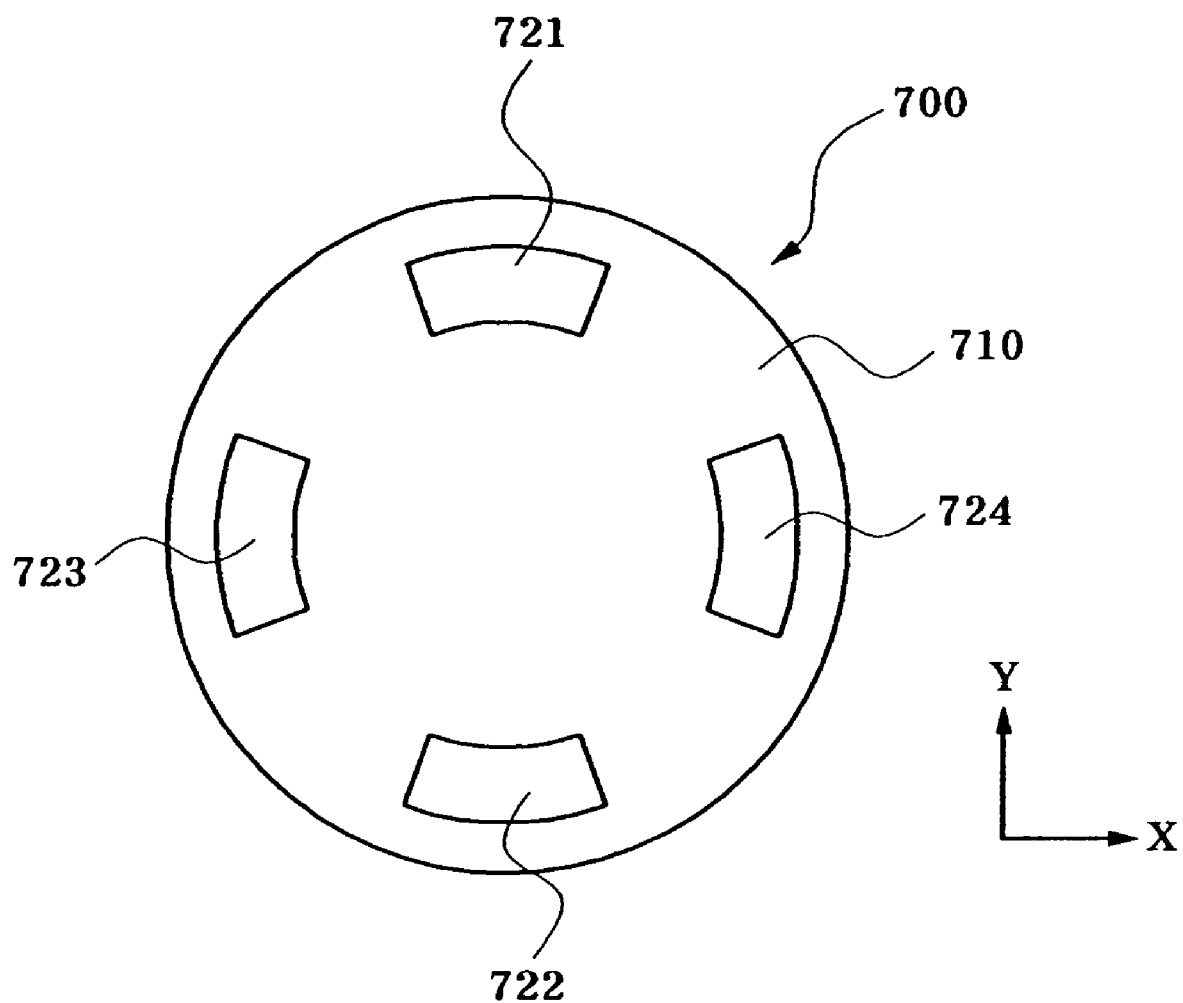

FIG. 5 is a flow chart illustrating a method for verifying optical proximity correction using layer versus layer comparison in accordance with the present invention, and FIGS. 6 and 7 are schematic plan views of various illuminating systems used in step 540 of the method of FIG. 5.

With reference to FIG. 5, an original design of a semiconductor device is prepared (step 510). Several patterns for forming various unit components of the semiconductor device are disposed in the original design. Thereafter, a revised design of the semiconductor device in consideration of an optical proximity effect is obtained by performing OPC (step 520). Patterns, which are damaged from the patterns of the original design, are disposed in the revised design. Thereafter, the original design and the revised design are compared with each other (step 530). This comparison is carried out by verifying a degree of coincidence between the patterns of the original design and the damaged patterns of the revised design. The damaged patterns generally include additions to the patterns of the original design, and, if necessary, include deletions from the patterns of the original design. Hereinafter, differences between the patterns of the original design and the damaged patterns of the revised design will be referred to as deviation patterns.

Thereafter, the deviation patterns, obtained by results of the above comparison, are divided according to illuminating systems (step 540). That is, in the case that an off-axis illuminating system is used, a photolithography process is performed to a designated direction according to positions of openings of the illuminating system. The above direction must be considered when the optical proximity effect is verified. For this reason, the method of the present invention divides the deviation patterns into several directions according to illuminating systems.

As shown in FIG. 6, in the case that a dipole illuminating system 600 having an optical shield portion 610 and openings 621 and 622 facing each other in the direction of the Y-axis is used, different bias are applied in the directions of the X-axis and the Y-axis in the photolithography process. In this case, the deviation patterns are divided into first deviation patterns in the direction of the Y-axis and second deviation patterns in the direction of the X-axis. As circumstance requires, the openings 621 and 622 may face each other in the direction of the X-axis. In this case, the deviation patterns are divided into patterns in the direction of the X-axis and patterns in the direction of the Y-axis.

As shown in FIG. 7, in the case that a crosspole illuminating system having an optical shield portion 710, openings 721 and 722 facing each other in the direction of the Y-axis, and openings 723 and 724 facing each other in the direction of the X-axis is used, different bias are applied in the orthogonal directions of the X-axis and the Y-axis and in the oblique directions of the X-axis and the Y-axis at an approximately 45° angle in the photolithography process. Accordingly, in this case, the deviation patterns are divided into first deviation patterns in the orthogonal directions of the X-axis and the Y-axis and second deviation patterns in the oblique directions of the X-axis and the Y-axis. In the case that a quadrapole illuminating system having openings which are not disposed in the directions of the X-axis and the Y-axis but are disposed in the oblique directions of the X-axis and the Y-axis is used, the deviation patterns are divided into the first and second deviation patterns in the same manner as the crosspole illuminating system.

Further, in the case that a multipole illuminating system having openings prepared in the number of N and disposed symmetrically with each other is used, the deviation patterns are divided into patterns in the directions corresponding to the angles of the openings. That is, the number of the divided patterns is N.

After the deviation patterns are divided, by comparing the divided deviation patterns to reference values, it is determined whether or not the original design contains errors, i.e., whether or not any pattern is omitted from the original design, and whether or not the revised design contains errors, i.e., whether or not the revised design is obtained in conformity with a designated rule (step 550).

Hereinafter, with reference to FIGS. 8 to 14, the method of the present invention using a dipole illuminating system will be described in more detail.

Figure 8:
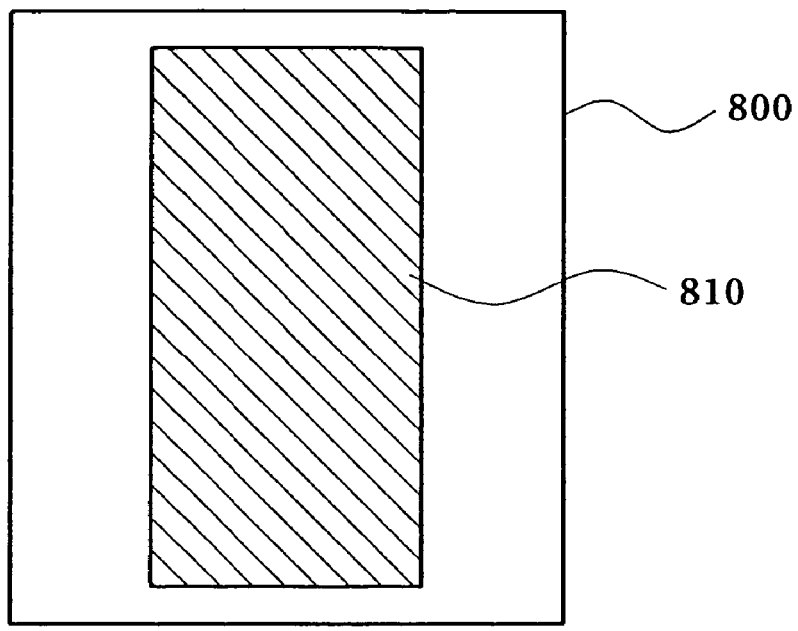
FIGS. 8 to 14 are schematic plan views illustrating a method for verifying optical proximity correction using layer versus layer comparison in accordance with the present invention, when a dipole illuminating system is used.
Figure 9:
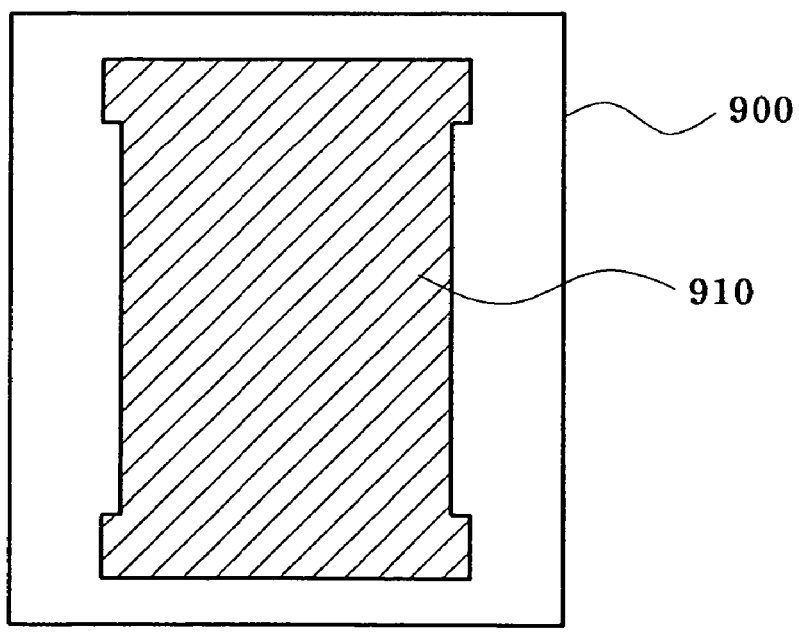
Figure 10:
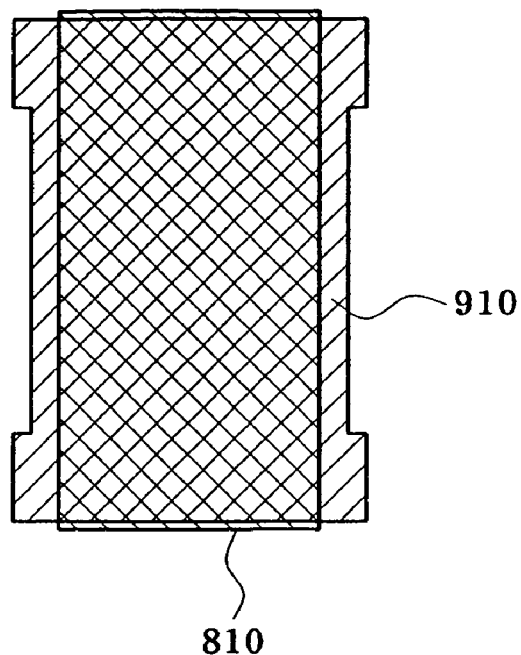

First, as shown in FIG. 8, an original design 800 of a semiconductor device is prepared. Several patterns 810 for forming various unit components of the semiconductor device are disposed in the original design 800. Thereafter, as shown in FIG. 9, a revised design 900 of the semiconductor device in consideration of an optical proximity effect is obtained by performing OPC. Patterns 910, which are damaged from the patterns 810 of the original design 800, are disposed in the revised design 900. Thereafter, as shown in FIG. 10, the original design 800 (in FIG. 8) and the revised design 900 (in FIG. 9) are compared with each other. This comparison is carried out by verifying a degree of coincidence between the patterns 810 of the original design 800 and the damaged patterns 910 of the revised design 900.

Figure 11:
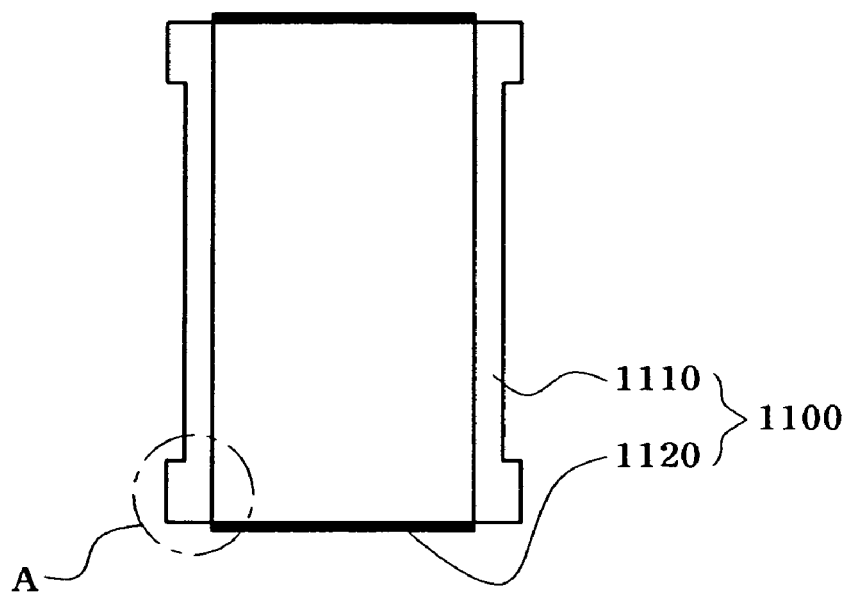

As the results of the above comparison, as shown in FIG. 11, deviation patterns 1100, denoting differences between the patterns 810 of the original design 800 and the damaged patterns 910 of the revised design 900, i.e., having non-overlapping portions of the patterns 810 of the original design 800 and the damaged patterns 910 of the revised design 900, are obtained. The deviation patterns 1100 include first deviation patterns 1110, which are not present in the patterns 810 of the original design 800 and are present in the damaged patterns 910 of the revised design 900, and second deviation patterns 1120, which are present in the patterns 810 of the original design 800 and are not present in the damaged patterns 910 of the revised design 900.

Figure 12:
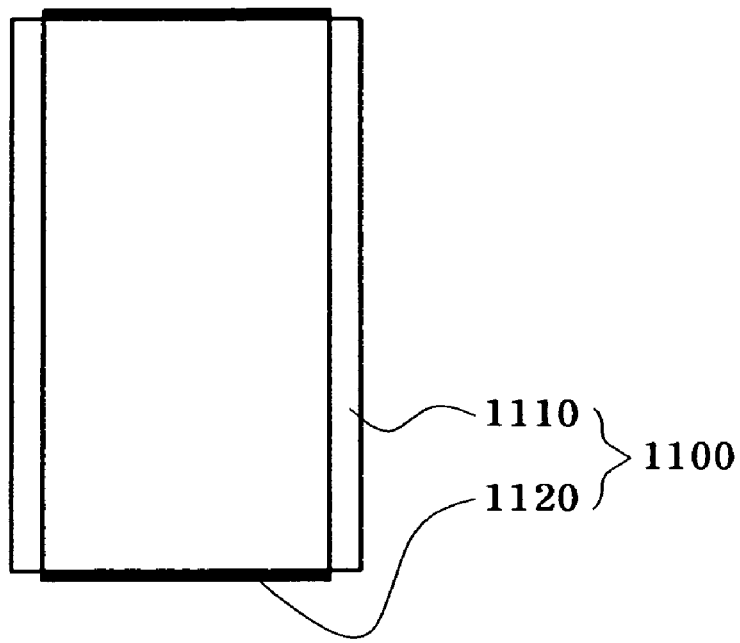

Thereafter, as shown in FIG. 12, edge portions (portions "A" in FIG. 11) of the deviation patterns 1100 are removed. Generally, bias having different intensities are applied to side portions and edge portions of patterns. Accordingly, the side portions and the edge portions of the patterns, to which bias having different intensities are applied, must be divided. Then, the deviation patterns 1100 are divided into the first deviation patterns 1110 formed in the direction of the X-axis and the second deviation patterns 1120 formed in the direction of the Y-axis. Although this embodiment, for the sake of convenience, describes the first deviation patterns 1100 coinciding portions, which are not present in the patterns 810 of the original design 800 and are present in the damaged patterns 910 of the revised design 900, and the second deviation patterns 1120 coinciding portions, which are present in the patterns 810 of the original design 800 and are not present in the damaged patterns 910 of the revised design 900, the first and second deviation patterns 1110 and 1120 are not limited thereto.

Figure 13:
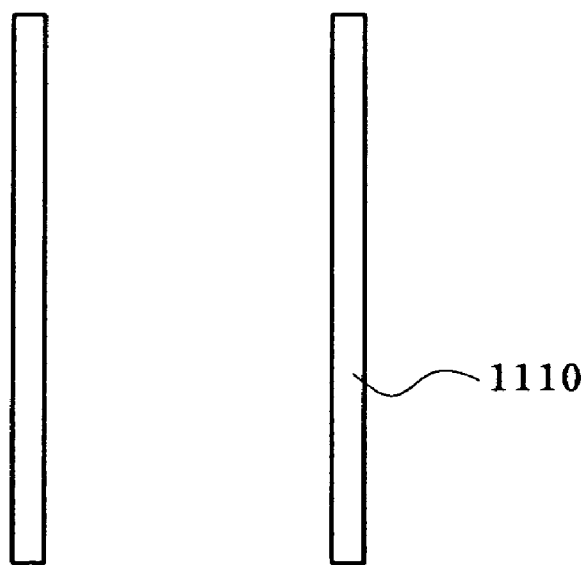

Thereafter, as shown in FIG. 13, by comparing the first deviation patterns 1110 to a first reference value, it is determined whether or not the original design 800 (in FIG. 8) contains errors, i.e., whether or not any of the patterns 810 of the original design 800 (in FIG. 8) formed in the direction of the X-axis is omitted, and whether or not the revised design 900 (in FIG. 9) contains errors, i.e., whether or not optical proximity correction in the direction of the X-axis is performed in conformity with a designated rule. For example, in the case that a fundamental rule of optical proximity correction limits the sizes of the deviation patterns formed in the direction of the X-axis to 30 nm, the first reference value is used to determine whether or not the sizes of the first deviation patterns 1110 are less than 30 nm, thereby determining whether or not the sizes of the first deviation patterns 1110 are less than 30 nm. As results of the determination, when it is determined that the sizes of the first deviation patterns 1110 are not less than 30 nm, it is determined that the optical proximity correction has not been correctly performed. In the case that the optical proximity correction has not been correctly performed, patterns, which are formed on a wafer by the photolithography process, may be defective. Consequently, when the optical proximity correction is verified by the above method, it is possible to accurately determine whether or not the optical proximity correction in the direction of the X-axis has been correctly performed.

Figure 14:

Thereafter, as shown in FIG. 14, by comparing the second deviation patterns 1120 to a second reference value, it is determined whether or not the original design 800 (in FIG. 8) contains errors, i.e., whether or not any of the patterns 810 of the original design 800 (in FIG. 8) formed in the direction of the Y-axis is omitted, and whether or not the revised design 900 (in FIG. 9) contains errors, i.e., whether or not optical proximity correction in the direction of the Y-axis is performed in conformity with a designated rule. For example, in the case that a fundamental rule of optical proximity correction limits the sizes of the deviation patterns formed in the direction of the Y-axis to 10 nm, the second reference value is used to determine whether or not the sizes of the second deviation patterns 1120 are less than 10 nm, thereby determining whether or not the sizes of the second deviation patterns 1120 are less than 10 nm. As results of the determination, when it is determined that the sizes of the second deviation patterns 1120 are not less than 10 nm, it is determined that the optical proximity correction has not been correctly performed. In the case that the optical proximity correction has not been correctly performed, patterns, which are formed on a wafer by the photolithography process, may be defective. Consequently, when the optical proximity correction is verified by the above method, it is possible to accurately determine whether or not the optical proximity correction in the direction of the Y-axis has been correctly performed.

As apparent from the above description, the present invention provides a method for verifying optical proximity correction using layer versus layer (LVL) comparison, in which the optical proximity correction is verified according to directions in consideration of an off-axis illuminating system having directionality, thereby enabling correct and accurate inspection of differences between an original design of a semiconductor device and a revised design of the semiconductor device and verification of accuracy of the optical proximity correction.

Although the selected embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for making a semiconductor device using an illuminating system having a directionality, the method comprising:

obtaining an original design associated with a semiconductor device:

performing optical proximity correction on the original design to obtain a revised design;

extracting first deviation patterns by comparing the revised design and the original design with each other, wherein the first deviation patterns are defined as a first difference between first edges of the revised design and the original design, the first difference being in a first direction that is parallel to a direction axis of the illumination system:

extracting second deviation patterns by comparing the revised design and the original design with each other, wherein the second deviation patterns are defined as a second difference between second edges of the revised design and the original design. the second difference being along a second direction that is not parallel to the direction axis of the illumination system:

determining whether a first error of the optical proximity correction exists on the first deviation patterns by a first reference value: and determining whether a second error of the optical proximity correction exists on the second deviation patterns by a second reference value, wherein the first reference value is different from the second reference value according to the directionality of the illumination system.

2. The method as set forth in claim 1, wherein the first deviation patterns are in orthogonal directions and the second deviation patterns are in oblique directions when the illuminating system is a crosspole or quadrapole illuminating system.

3. The method as set forth in claim 1, wherein the first deviation patterns are in a horizontal direction and the second deviation patterns are in a vertical direction when the illuminating system is a dipole illuminating system.

4. The method as set forth in claim 1, wherein the first and second deviation patterns are in N directions corresponding to angles of openings of the illuminating system when the illuminating system is a multipole illuminating system having the openings prepared in the number of N.

5. The method as set forth in claim 1, further comprising removing edge portions of the first and second deviation patterns, after the comparison between the revised design and the original design.

6. A method for verifying optical proximity correction using a layer-versus-layer comparison, the method comprising:
- obtaining a first design associated with a semiconductor device:
- performing optical proximity correction on the first design to obtain a second design using a dipole illuminating system;
- extracting a first deviation pattern by comparing the a second design and the first design with each other, wherein the first deviation patterns are defined as a first difference between first edges of the second design and the first design. the first difference being in a first direction that is parallel to a direction axis of the illumination;
- extracting a second deviation pattern by comparing the second design and the first design with each other, wherein the second deviation patterns are defined as a second difference between second edges of the second design and the first design. the second difference being along a second direction that is not parallel to the direction axis of the illumination system:
- determining whether a first error of the optical proximity correction exists on the first deviation patterns by a first reference value: and
- determining whether a second error of the optical proximity correction exists on the second deviation patterns by a second reference value.
- wherein the first reference value is different from the second reference value according to the directionality of the illumination system.

7. The method of claim 6, wherein the first and second directions are substantially orthogonal to each other.

8. The method of claim 7, wherein the first and second directions are vertical and horizontal directions, respectively.

9. The method of claim 6, wherein the first and second designs are original and revised designs, respectively.

* * * * *